US012583211B2

(12) United States Patent
Chadha et al.

(10) Patent No.: US 12,583,211 B2
(45) Date of Patent: Mar. 24, 2026

(54) SUBSTRATE SUPPORT ASSEMBLY WITH MULTIPLE DISCS

(71) Applicant: Applied Materials, Inc., Santa Clara, CA (US)

(72) Inventors: Arvinder Manmohan Singh Chadha, San Jose, CA (US); Chad Eric Mair, Dripping Springs, TX (US)

(73) Assignee: Applied Materials, Inc., Santa Clara, CA (US)

( * ) Notice: Subject to any disclaimer, the term of this patent is extended or adjusted under 35 U.S.C. 154(b) by 322 days.

(21) Appl. No.: 18/371,972

(22) Filed: Sep. 22, 2023

(65) Prior Publication Data

US 2025/0100263 A1 Mar. 27, 2025

(51) Int. Cl.
*B32B 37/06* (2006.01)
*B32B 37/08* (2006.01)
(Continued)

(52) U.S. Cl.
CPC .............. *B32B 37/06* (2013.01); *B32B 37/08* (2013.01); *B32B 37/24* (2013.01); *B32B 43/006* (2013.01); *G01N 21/88* (2013.01); *H01J 37/32715* (2013.01); *B32B 2037/243* (2013.01); *B32B 2309/02* (2013.01); *B32B 2311/00* (2013.01); *B32B 2315/00* (2013.01);
(Continued)

(58) Field of Classification Search
CPC ..... H01J 2237/2007; H01J 2237/24592; H01J 37/32715; B32B 2037/243; B32B 2309/02; B32B 2311/00; B32B 2315/00; B32B 37/06; B32B 37/08; B32B 37/24; B32B 43/006; G01N 21/88; H02N 13/00; H01L 21/67103; H01L 21/67109; H01L 21/68785; H01L 21/6831; H01L 21/68757
See application file for complete search history.

(56) References Cited

U.S. PATENT DOCUMENTS

| | | | |
|---|---|---|---|
| 6,853,533 B2 | 2/2005 | Parkhe | |
| 7,479,456 B2 | 1/2009 | Buchberger, Jr. et al. | |

(Continued)

FOREIGN PATENT DOCUMENTS

| | | | |
|---|---|---|---|
| JP | 2022056824 A | 4/2022 | |

OTHER PUBLICATIONS

International Search Report and Written Opinion for International Application No. PCT/US2024/012384, mailed Jun. 12, 2024, 10 Pages.

*Primary Examiner* — William P Fletcher, III

(74) *Attorney, Agent, or Firm* — Lowenstein Sandler LLP

(57) ABSTRACT

A method for bonding components of an electrostatic chuck includes applying a first melting point depressing layer (MDL) to a bottom surface of a first puck plate including one or more functional elements of an electrostatic chuck. A second MDL is applied to a top surface of a second puck plate including one or more functional elements of the electrostatic chuck, and a metal interlayer is provided between the first MDL and the second MDL. The first puck plate, the metal interlayer, and the second puck plate are aligned to form a puck assembly, and the puck assembly is heated, to a temperature at or near the eutectic temperature of the first MDL or the second MDL, to thermally bond the first puck plate to the metal interlayer and the metal interlayer to the second puck plate.

25 Claims, 12 Drawing Sheets

(51) Int. Cl.

| | |
|---|---|
| *B32B 37/24* | (2006.01) |
| *B32B 43/00* | (2006.01) |
| *G01N 21/88* | (2006.01) |
| *H01J 37/32* | (2006.01) |
| *H02N 13/00* | (2006.01) |

(52) U.S. Cl.
CPC .................. *H01J 2237/2007* (2013.01); *H01J 2237/24592* (2013.01); *H02N 13/00* (2013.01)

(56) References Cited

U.S. PATENT DOCUMENTS

| | | | |
|---|---|---|---|
| 7,589,950 | B2 | 9/2009 | Parkhe et al. |
| 9,358,702 | B2 | 6/2016 | Banda et al. |
| 9,472,410 | B2 | 10/2016 | Sadjadi et al. |
| 9,520,315 | B2 | 12/2016 | Parkhe et al. |
| 9,558,981 | B2 | 1/2017 | Boyd, Jr. et al. |
| 9,622,375 | B2 | 4/2017 | Busche et al. |
| 9,627,231 | B2 | 4/2017 | Narendrnath et al. |
| 9,646,893 | B2 * | 5/2017 | Dickerson ............. H01L 21/324 |
| 9,666,466 | B2 | 5/2017 | Parkhe et al. |
| 9,669,653 | B2 | 6/2017 | Parkhe et al. |
| 9,685,356 | B2 | 6/2017 | Parkhe et al. |
| 9,831,111 | B2 | 11/2017 | Busche et al. |
| 9,969,022 | B2 | 5/2018 | Parkhe |
| 10,008,399 | B2 | 6/2018 | Parkhe |
| 10,008,404 | B2 | 6/2018 | Parkhe |
| 10,020,218 | B2 | 7/2018 | Boyd, Jr. et al. |
| 10,079,165 | B2 | 9/2018 | Parkhe et al. |
| 10,186,444 | B2 | 1/2019 | Kim et al. |
| 10,490,435 | B2 | 11/2019 | Willwerth et al. |
| 2003/0047589 | A1 * | 3/2003 | Fujii ................... H01L 21/6831 |
| | | | 228/122.1 |
| 2015/0044947 | A1 | 2/2015 | Lu et al. |
| 2017/0352565 | A1 | 12/2017 | Zhang et al. |
| 2017/0352566 | A1 | 12/2017 | Ramaswamy et al. |
| 2017/0352567 | A1 | 12/2017 | Cho et al. |
| 2018/0190528 | A1 * | 7/2018 | Parkhe ............. H01L 21/67109 |
| 2020/0393242 | A1 * | 12/2020 | Vishwanath ...... H01J 37/32807 |
| 2021/0066107 | A1 | 3/2021 | Zhang et al. |

* cited by examiner

600

600

800
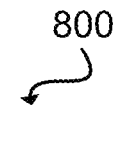
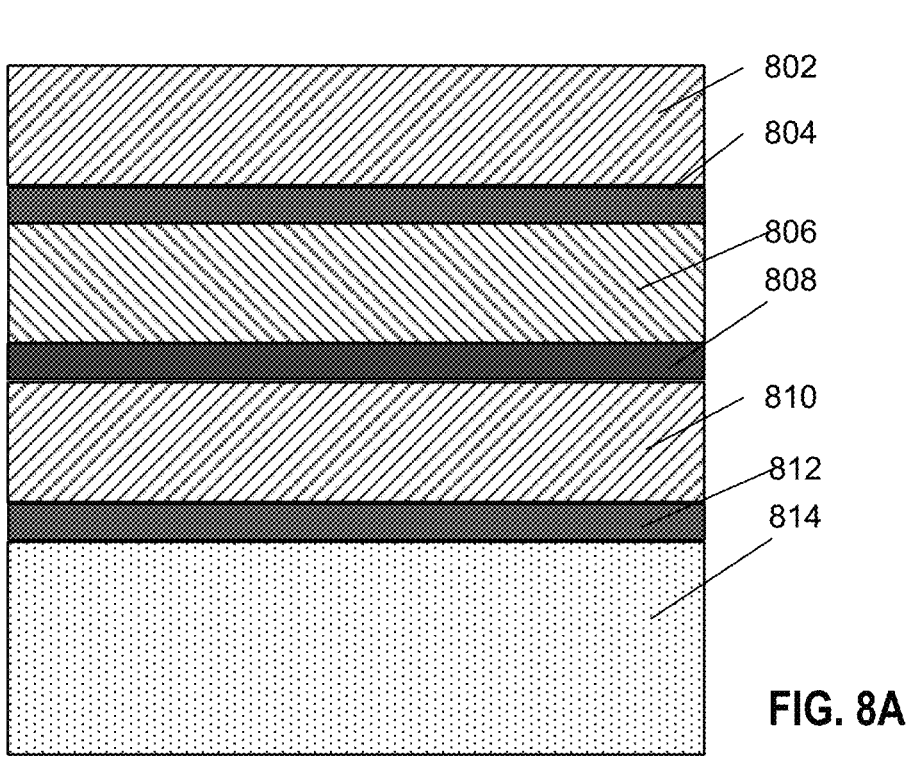
FIG. 8A
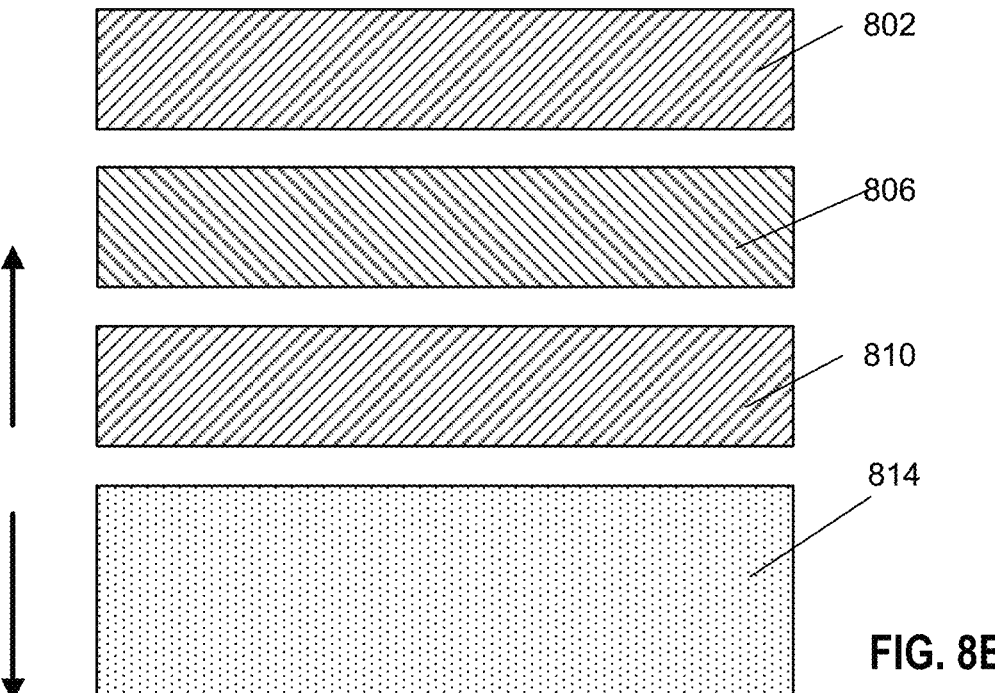
FIG. 8B

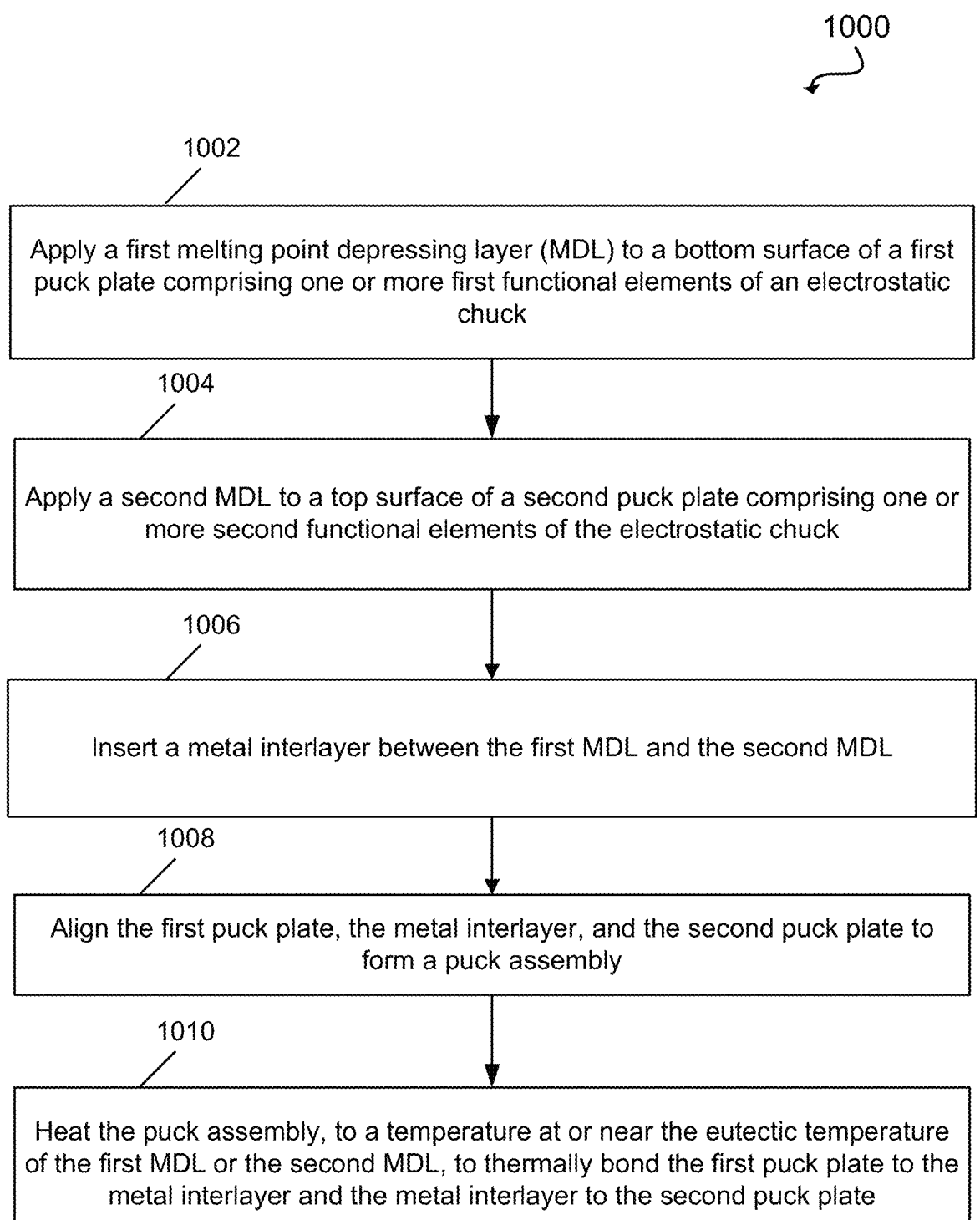

1000

1002

Apply a first melting point depressing layer (MDL) to a bottom surface of a first puck plate comprising one or more first functional elements of an electrostatic chuck

1004

Apply a second MDL to a top surface of a second puck plate comprising one or more second functional elements of the electrostatic chuck

1006

Insert a metal interlayer between the first MDL and the second MDL

1008

Align the first puck plate, the metal interlayer, and the second puck plate to form a puck assembly

1010

Heat the puck assembly, to a temperature at or near the eutectic temperature of the first MDL or the second MDL, to thermally bond the first puck plate to the metal interlayer and the metal interlayer to the second puck plate

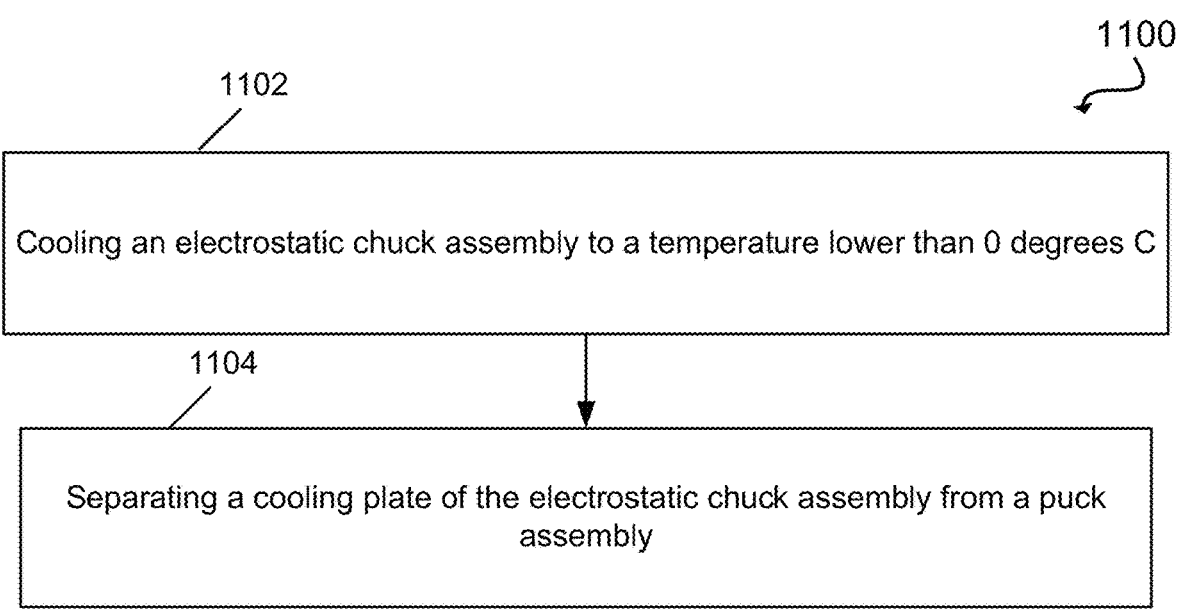

Cooling an electrostatic chuck assembly to a temperature lower than 0 degrees C

1104

Separating a cooling plate of the electrostatic chuck assembly from a puck assembly

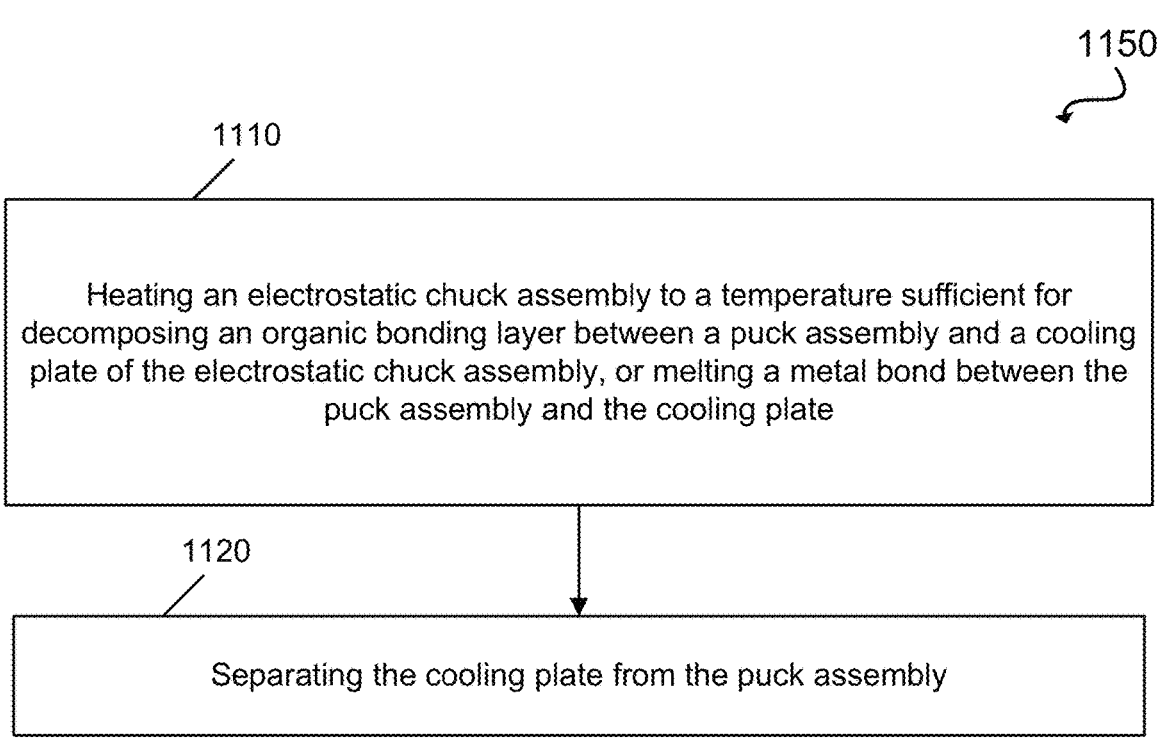

Heating an electrostatic chuck assembly to a temperature sufficient for decomposing an organic bonding layer between a puck assembly and a cooling plate of the electrostatic chuck assembly, or melting a metal bond between the puck assembly and the cooling plate

1120

Separating the cooling plate from the puck assembly

Inspect a periphery of an electrostatic chuck assembly with a contact or a non-contact detector

1204

Identify erosion at one or more locations on one or more bonding layers of the electrostatic chuck assembly based on a result of the inspecting

1206

Fill the one or more locations on one or more bonding layers with a bonding material

SUBSTRATE SUPPORT ASSEMBLY WITH MULTIPLE DISCS

TECHNICAL FIELD

Some embodiments of the present invention relate, in general, to a substrate support assembly with multiple discs.

BACKGROUND

Electrostatic chucks are widely used to hold substrates, such as semiconductor wafers, during substrate processing in processing chambers. Electrostatic chucks typically include one or more electrodes embedded within a unitary chuck body which includes a dielectric or semi-conductive ceramic material across which an electrostatic clamping field can be generated.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to a chucking surface to allow a greater degree of control over substrate temperature.

Various processes used in the fabrication of integrated circuits may call for high temperatures and/or wide temperature ranges for substrate processing. However, electrostatic chucks in etch processes typically operate in a temperature range of up to about 120° C. At temperatures above about 120° C., the components of many electrostatic chucks will begin to fail due to various issues such as de-chucking in AlO electrostatic chucks, plasma erosion from corrosive chemistry, bond reliability, and so on.

SUMMARY

Some embodiments of the present invention described herein cover a method for bonding two or more layers of an electrostatic chuck (ESC). The method includes applying a first melting point depressing layer (MDL) to a bottom surface of a first puck plate having one or more first functional elements. The method further includes applying a second MDL to a top surface of a second puck plate having one or more second functional elements. The method further includes laying a metal interlayer between the first MDL and the second MDL, and aligning the first puck plate, the metal interlayer, and the second puck plate to form a puck assembly. The method further includes heating the puck assembly, to a temperature at or near the eutectic temperature of the first MDL and/or the second MDL, to thermally bond the first puck plate to the metal interlayer and the metal interlayer to the second puck plate.

Some embodiments of the present invention described herein cover a method for debonding two or more layers of an ESC. The method may include performing at least one of a) cooling a substrate support assembly to a temperature lower than 0° C.; or b) heating the substrate support assembly to a temperature sufficient for at least one of c) decomposing an organic bonding layer between a puck assembly and a cooling plate of the substrate support assembly or d) melting a metal bond between the puck assembly and the cooling plate. The method may further include separating a first puck plate of the puck assembly from a second puck plate, and at least partially removing an organic bonding layer between the first puck plate and the cooling plate, and/or the first puck plate and the second puck plate using a chemical treatment, mechanical treatment, radiation, laser ablation, chemical decomposition, polishing, heating in a furnace, liquid nitrogen, or a combination thereof.

Some embodiments of the present invention described herein cover a method for repairing an ESC. The method includes inspecting a periphery of the ESC assembly with a contact or a non-contact detector, identifying erosion at one or more locations on one or more bonding layers of the electrostatic chuck assembly based on a result of the inspecting, and filling the one or more locations on one or more bonding layers with a bonding material. The method may further include rotating the electrostatic chuck assembly along a vertical or horizontal axis, and depositing, using a piezo jet dispenser, the bonding material in the one or more locations.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 8A and 8B depict a sectional side view of another embodiment of an electrostatic chuck assembly;

FIG. 10 illustrates one embodiment of a process for bonding two or more layers of an electrostatic chuck assembly.

FIG. 11A illustrates one embodiment of a process for debonding two or more layers of an electrostatic chuck assembly.

FIG. 11B illustrates one embodiment of a process for debonding two or more layers of an electrostatic chuck assembly.

DETAILED DESCRIPTION OF EMBODIMENTS

Figure 1:
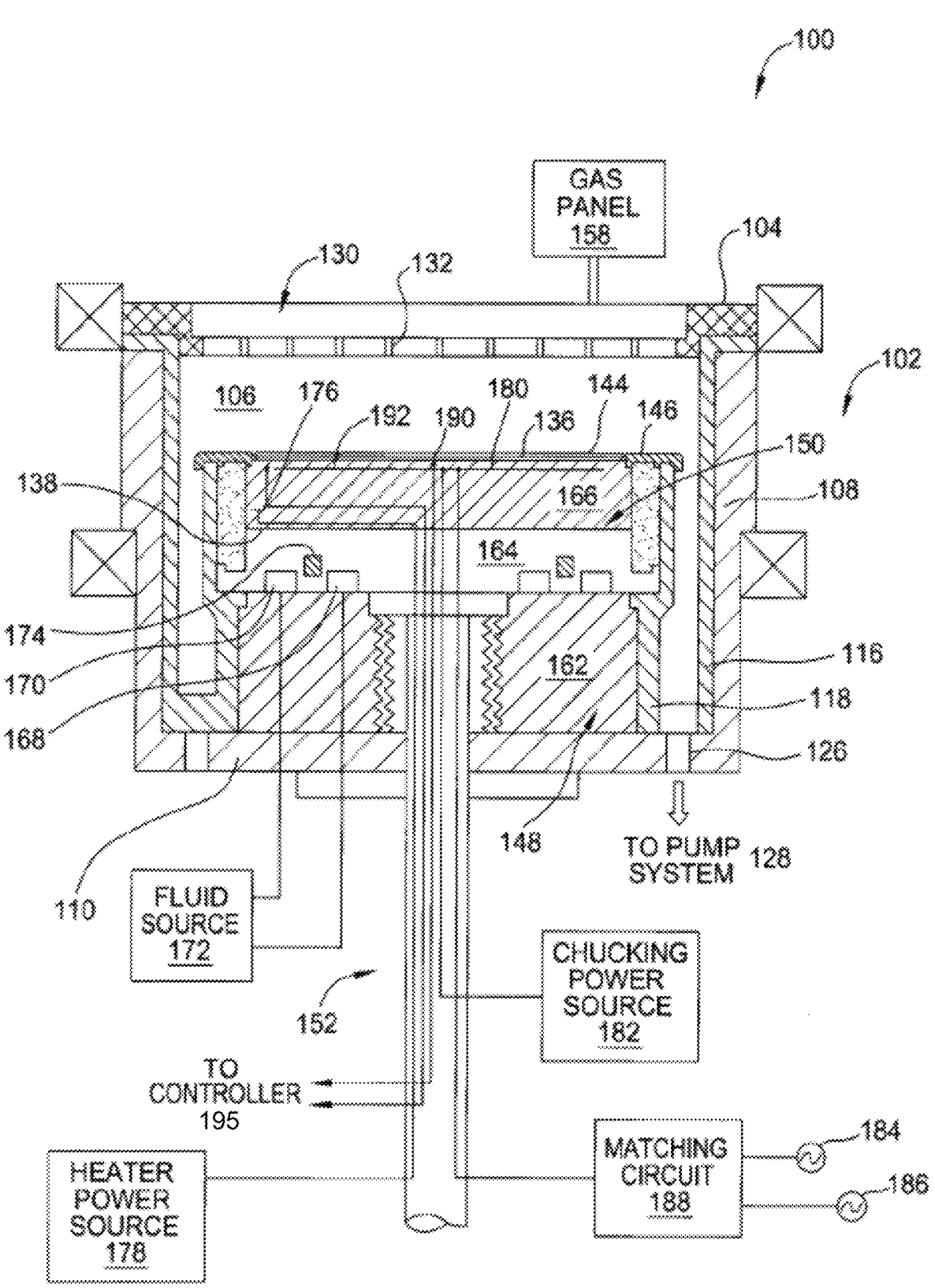
FIG. 1 depicts a sectional side view of one embodiment of a processing chamber.

Embodiments of the present invention provide methods for bonding two or more layers of a substrate support assembly, methods for debonding two or more layers of a substrate support assembly, and methods for repairing one or more layers of a substrate support assembly. In one embodiment, a melting point depressing layer (MDL), such as Ni, Ti, C, or Si, is applied to a bottom surface of a top puck plate of a substrate support assembly having one or more functional elements. The functional elements may include one or more of a clamp electrode, a zone heater, a pixelated heater, a radio frequency (RF) electrode, a gas channel, or a gas pocket. An additional MDL, such as Ni, Ti, C, or Si, is applied to a top surface of a bottom puck plate, also having one or more functional elements. Alternatively, the top puck plate and/or the bottom puck plate may have no functional elements at all. The method further includes laying a metal interlayer, such as a flexible graphite layer, an organic elastomer, Al, In, Ni, Ti, or an alloy including Ni—Ti or Mo—Mg, between the top MDL and the bottom MDL, and aligning the top puck plate, the metal interlayer, and the bottom puck plate to form a puck assembly. Alternatively, the metal interlayer may be disposed on top of the first MDL layer, and the second MDL layer may be applied on top of the metal interlayer before aligning the top puck plate, the metal interlayer, and the bottom puck plate. The MDL layers can be made of the same material or different materials. Similarly, the top puck plate and the bottom puck plate can be made of the same material or different materials. Examples of materials that may be used in forming the top puck plate and/or the bottom plate may include niobium, aluminum oxide, aluminum nitride, or sapphire. The method further includes heating the puck assembly to a temperature at or near the eutectic temperature of either MDL layers, and to thermally bond the top puck plate to the metal interlayer and the metal interlayer to the bottom puck plate.

Substrate support assemblies need to be repaired from time to time and sometimes there is a need to partially repair bond edges or completely de-bond and re-bond a stack of the substrate support assembly in order to be cost effective and performance efficient. One advantage of the disclosed methods for manufacturing modular substrate support assemblies is that each disc can include a different ceramic material, and each disc can be isolated and repaired separately when one or more functional elements within a disc are not functioning as intended or expected. Additionally, some etch and metal deposition processes are trending towards on-wafer temperatures. For example, a transient liquid phase (TLP) bond using a Ni MDP and an Al interlayer could operate at high temperatures about 100-200° C. above the bonding temperature. For processes such as cryogenic etch, the methods disclosed herein allow for incorporation of a high thermal conductivity bond layer. In embodiments, TLP bonding of ESC plates using MDP layer(s) provides a path to improve the adhesion to ceramics such as $Al_2O_3$ and AlN by modifying the interlayer wettability of the ceramic. In embodiments, tuning the MDP layer(s) thickness and material composition also allows for fine tuning of the bonding layer mechanical properties and chemical resistance by controlling the joint composition and bonding temperature trajectory. Additionally, using the TLP bonding methods disclosed herein does not require the application of high temperature and pressure to the substrates during the bonding process when compared to traditional diffusion bonding processes.

FIG. 1 is a sectional view of one embodiment of a processing chamber 100 having an electrostatic chuck assembly 150 disposed therein. While an electrostatic chuck assembly is shown, in embodiments the electrostatic chuck assembly may be replaced with other types of substrate support assemblies, such as a vacuum chuck assembly, a heater assembly, and so on. The electrostatic chuck assembly 150 includes an electrostatic puck 166 having an upper puck plate bonded to a lower puck plate, as will be discussed in greater detail below. The electrostatic chuck assembly 150 may additionally include more than two plates, where each plate may include zero or more different functional elements of the electrostatic chuck assembly (e.g., chucking electrodes, radiofrequency (RF) electrodes, main heating electrodes, auxiliary heating electrodes, cooling channels, and so on). The puck 166 can be coupled to a cooling plate by multiple fasteners, as discussed in greater detail below. The puck 166 can also be bonded to the cooling plate by a bond such as a metal bond, an organic bond, a polymer bond, etc.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, a substrate support assembly 148 is disposed in the interior volume 106 of the processing chamber 100 below the gas distribution assembly 130. The substrate support assembly 148 holds a substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and electrostatic chuck assembly 150. In one embodiment, the electrostatic chuck assembly 150 further includes a thermally conductive base referred to herein as a cooling plate 164 coupled to an electrostatic puck (referred to hereinafter as a puck 166) by multiple fasteners. The electrostatic chuck assembly 150 described in embodiments may be used for Johnsen-Rahbek and/or Coulombic electrostatic chucking in embodiments.

In one embodiment, a protective ring 146 is disposed over a portion of the puck 166 at an outer perimeter of the puck 166. In one embodiment, the puck 166 is coated with a protective layer 136. Alternatively, the puck 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), YAlO3 (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In one embodiment, the puck 166 includes an upper puck plate (not shown) and a lower puck plate (not shown) bonded by a metal and/or organic bond. The puck may also include more than two plates. The upper puck plate and/or one or more other plates may be a dielectric or electrically insulative material (e.g., having an electrical resistivity of greater than $10^{14}$ Ohm·meter) that is usable for semiconductor processes at temperatures of 180° C. and above. In one embodiment, the upper puck plate and/or other plate(s) is composed of materials usable from about 20° C. to about 500° C. In one embodiment, the upper puck plate and/or other plate(s) is AlN. The AlN upper puck plate and/or other plate(s) may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the upper puck plate and/or other plate(s) is $Al_2O_3$. The $Al_2O_3$ upper puck plate and/or other plate(s) may be undoped or may be doped. For example, the $Al_2O_3$ may be doped with Titanium dioxide ($TiO_2$) or a transition metal oxide.

The lower puck plate and/or one or more other plates may have a coefficient of thermal expansion that is matched to a coefficient of thermal expansion of the upper puck plate. In one embodiment, the lower puck plate and/or other plate(s) is a SiC porous body that is infiltrated with an AlSi alloy (referred to as AlsiSiC). The lower puck plate and/or other plate(s) may alternatively be AlN or $Al_2O_3$. In one embodiment, the lower puck plate and/or other plate(s) is undoped AlN or undoped $Al_2O_3$. In one embodiment, the lower puck plate and/or other plate(s) is composed of the same material as the upper puck plate. The AlSiSiC material, AlN or $Al_2O_3$ may be used, for example, in reactive etch environments or in inert environments.

In one embodiment, the lower puck plate and/or other plate(s) is Molybdenum. Molybdenum may be used, for example, if the puck 166 is to be used in an inert environment. Examples of inert environments include environments in which inert gases such as Ar, O2, N, etc. are flowed. Molybdenum may be used, for example, if the puck 166 is to chuck a substrate for metal deposition. Molybdenum may also be used for the lower puck plate and/or other plate(s) for applications in a corrosive environment (e.g., etch applications). In such an embodiment, exposed surfaces of the lower puck plate and/or other plate(s) may be coated with a plasma resistant coating after the lower puck plate is bonded to the upper puck plate. The plasma coating may be performed via a plasma spray process. The plasma resistant coating may cover, for example, side walls of the lower puck plate and an exposed horizontal step of the lower puck plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck 166. The cooling plate 164 and/or puck 166 may include one or more optional embedded heating elements 176, optional embedded thermal isolators 174 and/or optional conduits 168, 170 to control a lateral temperature profile of the substrate support assembly 148. In embodiments, different functions of the puck 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck 166 may include both RF electrodes and chucking electrodes. In one embodiment, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck 166. The conduits 168, 170 and embedded heating elements 176 may be utilized to control the temperature of the puck 166, thereby heating and/or cooling the puck 166 and a substrate (e.g., a wafer) being processed. In one embodiment, the puck 166 includes two separate heating zones that can maintain distinct temperatures. In another embodiment, the puck 166 includes four different heating zones that can maintain distinct temperatures. The temperature of the electrostatic puck 166 and the thermally conductive base 164 may be monitored using multiple temperature sensors 190, 192, which may be monitored using a controller 195. The temperature sensors 190, 192 may be included in one plate of puck 166, which may be a same plate or different plate from the plate containing the heating elements 176.

The puck 166 may further include multiple gas passages such as grooves, mesas and other surface features that may be formed in an upper surface of the puck 166. The gas passages may be fluidly coupled to a source of a heat transfer (or backside) gas, such as He via holes drilled in the puck 166. In operation, the backside gas may be provided at controlled pressure into the gas passages to enhance the heat transfer between the puck 166 and the substrate 144.

In one embodiment, the puck 166 includes at least one clamping electrode 180 controlled by a chucking power source 182. The clamping electrode 180 may be included in one plate of puck 166. The clamping electrode 180 (also referred to as a chucking electrode) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of puck 166. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
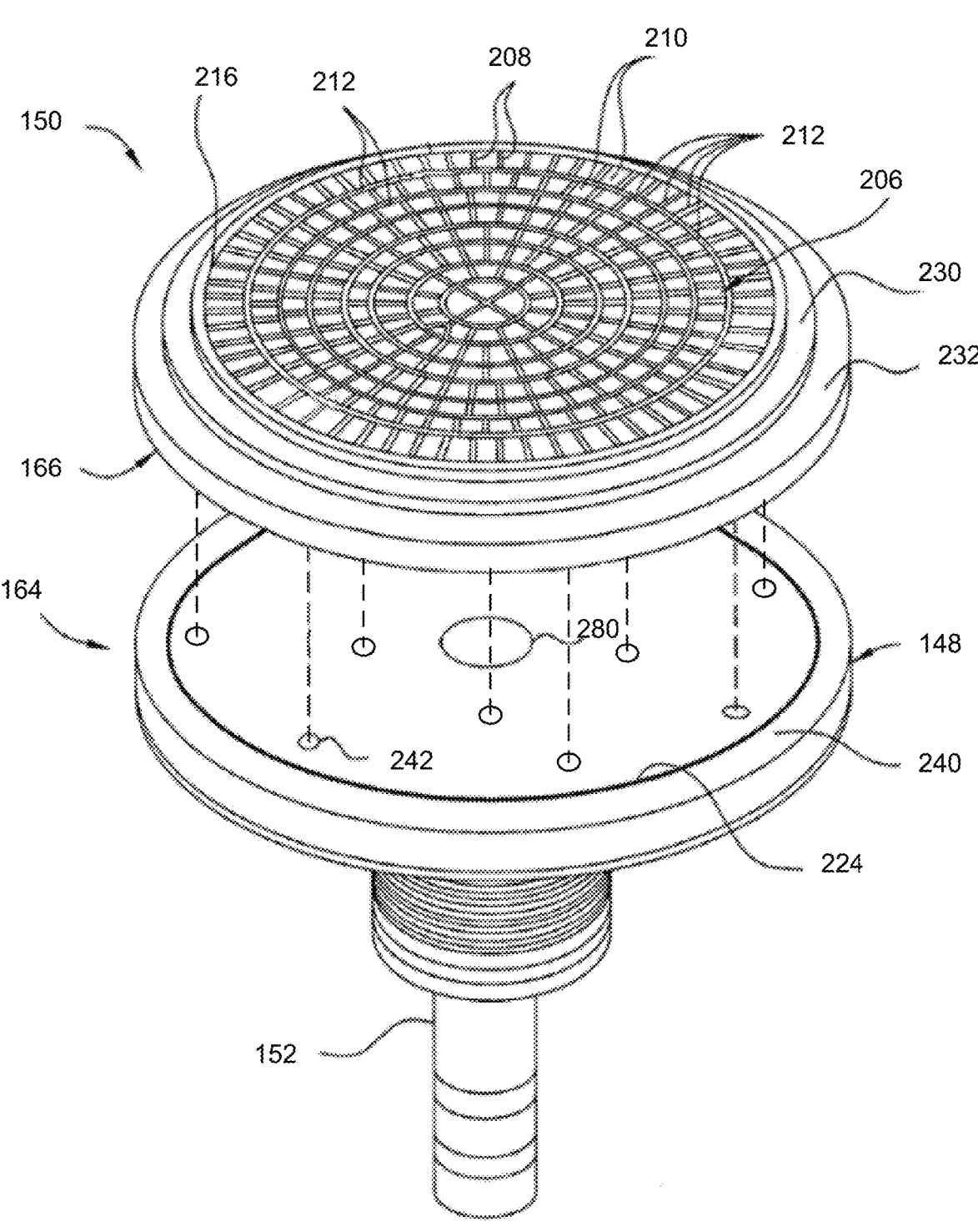
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck assembly 150 including the puck 166 and the pedestal 152. The electrostatic chuck assembly 150 includes the puck 166, as well as the cooling plate 164 attached to the puck 166. As shown, an o-ring 240 may be vulcanized to the cooling plate 164 along a perimeter of a top side of the cooling plate 164. Alternatively, the o-ring may be disposed on the top side of the cooling plate 164 without being vulcanized thereto. Some embodiments are discussed herein with reference to o-rings and gaskets that are vulcanized to at least a portion of the cooling plate 164. However, it should be understood that the o-rings and/or gaskets may alternatively be vulcanized to the lower puck plate. Alternatively, the o-rings and/or gaskets may not be vulcanized to any surface. In one embodiment, the o-ring 240 or gasket is a perfluoropolymer (PFP) o-ring or polyimide o-ring or gasket. Alternatively, other types of high temperature o-rings may be used. In one embodiment, thermally insulating high temperature o-rings or gaskets are used. The o-ring 240 or gasket may be a stepped o-ring or gasket having a first step at a first thickness and a second step at a second thickness. This may facilitate uniform tightening of fasteners by causing the amount of force used to tighten the fasteners to increase dramatically after a set amount of compression of the o-ring 240 or gasket.

Additional o-rings (not shown) or gaskets may also be vulcanized to the top side of the cooling plate around a hole 280 at a center of the cooling plate 164 through which cables are run. Other smaller o-rings or gaskets may also be vulcanized to the cooling plate 164 around other openings, around lift pins, and so forth. For example, a gasket (e.g., a PFP gasket or polyimide gasket) may be vulcanized to the top side of the cooling plate 164. Examples of PFPs usable for the gasket or o-ring 240 are Dupont's™ ECCtreme™, Dupont's KALREZ® and Daikin's® DUPRA™. The o-ring 240 or gasket may provide a vacuum seal between a chamber interior volume and interior volumes within the electrostatic chuck assembly 150. The interior volumes within the electrostatic chuck assembly 150 may include open spaces within the pedestal 152 for routing conduits and wiring.

In one embodiment, the cooling plate 164 additionally includes numerous features 242 through which fasteners are inserted. If a gasket is used, the gasket may have cutouts at each of the features 242. Fasteners may extend through each of the features 242 and attach to additional portions of the fasteners (or additional fasteners) that are inserted into additional features formed in the puck 166. For example, a bolt may extend through a feature 242 in the cooling plate 164 and be screwed into a nut disposed in a feature of the puck 166. Each feature 242 in the cooling plate 164 may line up to a similar feature (not shown) in a lower puck plate 232 of puck 166.

In one embodiment, the puck 166 has a disc-like shape having an annular periphery that may substantially match the shape and size of the substrate 144 positioned thereon. An upper surface of the puck 166 may have an outer ring 216, multiple mesas 206, 210 and channels 208, 212 between the mesas 210. In one embodiment, the puck 166 includes an upper puck plate 230 bonded to the lower puck plate 232 by a metal bond. In one embodiment, the upper puck plate 230 may be fabricated by an electrically insulative ceramic material. Suitable examples of the ceramic materials include aluminum nitride (AlN), alumina (Al$_2$O$_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material in order to minimize CTE mismatch and avoid thermo-mechanical stresses which may damage the puck 166 during thermal cycling. In one embodiment, the lower puck plate 232 is Molybdenum. In one embodiment, the lower puck plate is alumina. In one embodiment, the lower puck plate is AlN or Al$_2$O$_3$. The lower puck plate may be composed of a same material as the upper puck plate, but may have a different purity level, a different grain size, different amounts of dopants, and so on to provide different material properties for the lower puck plate than the upper puck plate in embodiments.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the lower puck plate 232 is preferably chosen to provide the desired electrical conductivity and to substantially match the CTE of the upper puck plate 230 material over the operating temperature range for the electrostatic chuck assembly 150. In one embodiment, the temperature may range from about 20° Celsius to about 500° Celsius. In one embodiment, matching the CTEs is based on selecting the MMC material so that the MMC material includes at least one material which is also used in the upper puck plate 230 material. In one embodiment, the upper puck plate 230 includes AlN. In one embodiment, the MMC material includes a SiC porous body that is infiltrated with an AlSi alloy.

The constituent materials and composition percentages of the MMC may be selected to provide an engineered material which meets desirable design objectives. For example, by suitably selecting the MCC material to closely match the CTEs of the lower puck plate 232 and upper puck plate 230, the thermo-mechanical stresses at an interface between the lower puck plate 232 and the upper puck plate 230 are reduced.

The cooling plate 164 attached below the puck 166 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the puck 166. The cooling plate 164 should provide good strength and durability as well as heat transfer properties.

Figure 3:
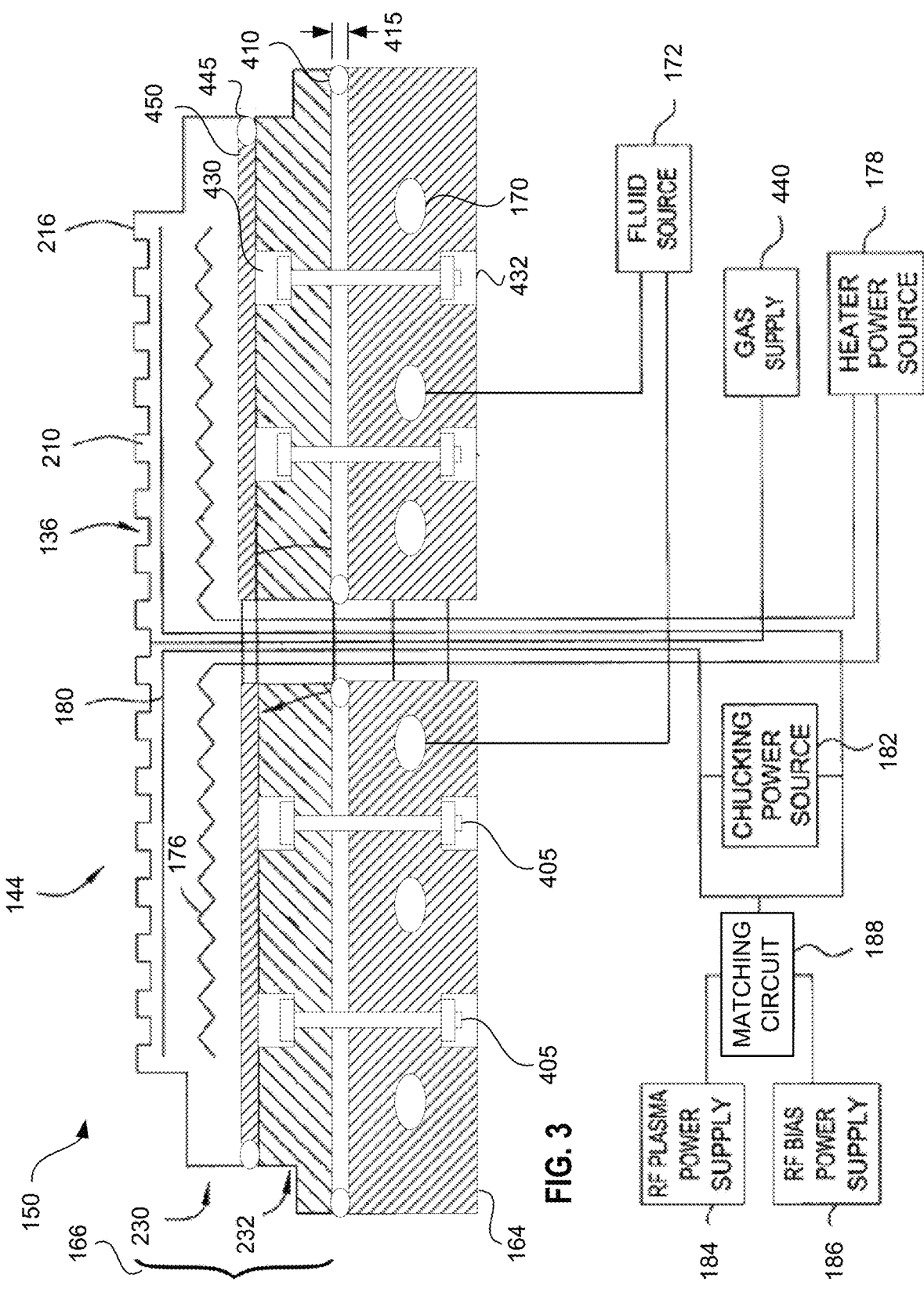
FIG. 3 depicts a sectional side view of one embodiment of an electrostatic chuck assembly.

FIG. 3 depicts a sectional side view of one embodiment of an electrostatic chuck assembly 150. The electrostatic chuck assembly 150 includes a puck 166 made up of an upper puck plate 230, and a lower puck plate 232 that are bonded together by a bond 450, which may be a metal bond. The electrostatic chuck assembly 150 may alternatively have more than two plates, such as three plates, four plates, five plates, and so on. Different techniques may be used to bond the multiple plates. One technique that may be used for bonding is metal bonding. Polymer bonding, diffusion bonding, organic bonding, and so on may also be performed to bond plates together. In some embodiments, all plates are bonded using a same bonding technique. In some embodiments, different bonding techniques are used for different plates. In one embodiment, diffusion bonding is used as a method of metal bonding plates of the electrostatic chuck assembly 150 together. In one embodiment, the upper puck plate 230 and the lower puck plate 232 comprise materials which include aluminum (e.g., AlN or $Al_2O_3$). Bond 450 may be a metal bond that may include an "interlayer" of aluminum foil which is placed in a bonding region between the upper puck plate 230 and the lower puck plate 232. Pressure and heat may be applied to form a diffusion bond between the aluminum foil and the upper puck plate 230 and between the aluminum foil and lower puck plate 232. In another embodiment, the diffusion bond may be formed using other interlayer materials which are selected based upon the materials used for upper puck plate 230 and lower puck plate 232. In another embodiment, the upper puck plate 230 may be directly bonded to the lower puck plate 232 using direct diffusion bonding in which no interlayer is used to form the bond. An organic bond, ceramic bond, polymer bond, or other type of bond may also be formed to bond the plates together.

In one embodiment, an o-ring 445 is used to protect bond 450. A plasma resistant and high temperature o-ring 445 may be made of a perfluoropolymer (PFP) or polyimide in embodiments. The o-ring 445 may be a PFP with inorganic additives such as SiC in an embodiment. The o-ring may be replaceable. When the o-ring 445 degrades it may be removed and a new o-ring may be stretched over the upper puck plate 230 and placed at a perimeter of the puck 166 at an interface between the upper puck plate 230 and the lower puck plate 232. The o-ring 445 may protect the metal bond 450 from erosion by plasma. In some embodiments, no o-ring is used to protect the bond 450.

The upper puck plate 230 includes mesas 210, channels 212 and an outer ring 216. In one embodiment, the upper puck plate 230 includes clamping electrodes 180 and one or more heating elements 176. Alternatively, the clamping electrodes 180 and heating elements 176 may be disposed in different plates (e.g., heating elements and/or clamping electrodes may be disposed in lower puck plate 232). The clamping electrodes 180 may be coupled to a chucking power source 182, and/or to an RF plasma power supply 184 and/or an RF bias power supply 186 via a matching circuit 188. The upper puck plate 230, lower puck plate 232 and/or other plates may additionally include gas delivery holes (not shown) through which a gas supply 440 pumps a backside gas such as He.

The upper puck plate 230 may have a thickness of about 3-25 mm. In one embodiment, the upper puck plate 230 has a thickness of about 3 mm. The clamping electrodes 180 may be located about 1 mm from an upper surface of the upper puck plate 230, and the heating elements 176 may be located about 1 mm under the clamping electrodes 180. The heating elements 176 may be screen printed heating elements having a thickness of about 10-200 microns. Alternatively, the heating elements may be resistive coils that use about 1-3 mm of thickness of the upper puck plate 230. In such an embodiment, the upper puck plate 230 may have a minimum thickness of about 5 mm. In one embodiment, the lower puck plate 232 has a thickness of about 8-25 mm.

The heating elements 176 are electrically connected to a heater power source 178 for heating the upper puck plate 230. The upper puck plate 230 may include electrically insulative materials such as AlN. The lower puck plate 232 and upper puck plate 232 (and/or one or more other plates) may be made of the same materials and/or different materials. In one embodiment, the lower puck plate 232 is made of materials which are different from the materials used for the upper puck plate 230. In one embodiment, the lower puck plate 232 is composed of a metal matrix composite material. In one aspect, the metal matrix composite material includes aluminum and silicon. In one embodiment, the metal matrix composite is a SiC porous body infiltrated with an AlSi alloy.

The lower puck plate 232 is coupled to and in thermal communication with a cooling plate 164 having one or more conduits 170 (also referred to herein as cooling channels) in fluid communication with fluid source 172. In one embodiment, the cooling plate 164 is coupled to the puck 166 by multiple fasteners 405. The fasteners 405 may be threaded fasteners such as nut and bolt pairs. As shown, in some embodiments the lower puck plate 232 includes multiple features 430 for accommodating the fasteners 405. The cooling plate 164 likewise may include multiple features 432 for accommodating the fasteners 405. In one embodiment, the features are bolt holes with counter bores. As shown, the features 430 are through features that extend through the lower puck plate 232. Alternatively, the features 430 may not be through features. In one embodiment, the features 430 are slots that accommodate a t-shaped bolt head or rectangular nut that may be inserted into the slot and then rotated 90 degrees. In one embodiment, the fasteners include washers, grafoil, aluminum foil, or other load spreading materials to distribute forces from a head of the fastener evenly over a feature. In some embodiments, fasteners are not used to connect puck 166 to cooling plate 164. In some embodiments, a bond is used to secure puck 166 to cooling plate 164.

In one embodiment (as shown), an o-ring 410 is vulcanized to (or otherwise disposed on) the cooling plate at a perimeter of the cooling plate 164. Alternatively, the o-ring 410 may be vulcanized or attached to the bottom side of the lower cooling plate 232. Alternatively, a gasket may be used. In some embodiments, fasteners 405 may be tightened to compress the o-ring 410 or gasket. The fasteners 405 may all be tightened with approximately the same force to cause a separation 415 between the puck 166 and the cooling plate 164 to be approximately the same (uniform) throughout the interface between the puck 166 and the cooling plate 164. This may ensure that the heat transfer properties between the cooling plate 164 and the puck 166 are uniform. In one embodiment, the separation 415 is about 2-10 mils. The separation may be 2-10 mils, for example, if the PFP o-ring 410 is used without a grafoil layer. If a grafoil layer is used along with the PFP o-ring 410, then the separation may be about 10-40 mils. Larger separation may decrease heat transfer, and cause the interface between the puck 166 and the cooling plate 164 to act as a thermal choke. In one embodiment, a conductive gas may be flowed into the separation 415 to improve heat transfer between the puck 166 and the cooling plate 164. In some embodiments, an o-ring or gasket is not used between puck 166 and cooling plate 164. In some embodiments, a separation 415 between puck 166 and cooling plate 164 minimizes the contact area between the puck 166 and the cooling plate 164.

In one embodiment (not shown), a grafoil layer or other flexible graphite layer is disposed between the puck 166 and the cooling plate 164. The flexible graphite may have a thickness of about 10-40 mil. The fasteners 405 may be tightened to compress the flexible graphite layer as well as the o-ring 410 or gasket. The flexible graphite may be thermally conductive, and may improve a heat transfer between the puck 166 and the cooling plate 164.

In one embodiment (not shown), the cooling plate 164 includes a base portion. In one embodiment, o-ring 410 may be vulcanized to the base portion. In one embodiment, the cooling plate 164 includes a spring loaded inner heat sink connected to the base portion by one or more springs. The springs apply a force to press the inner heat sink against the puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

In some embodiments, methods for bonding a non-monolithic electrostatic chuck assembly that includes two or more discs are discussed. Each of the discs may include one or more first functional elements, which may be selected and custom configured to design the electrostatic chuck, and then assembled to form an electrostatic chuck assembly. After the electrostatic chuck assembly is assembled and/or used, the assembly may be disassembled and one or more plates can be reused in other electrostatic chuck assemblies. Alternatively, they may be refurbished and/or reassembled to reform the same electrostatic chuck assembly after regular maintenance on the individual discs has been performed. Some embodiments cover methods for repairing an ESC. The method may include filling one or more locations on one or more bonding layers with a bonding material.

Figures 4A, 4B:
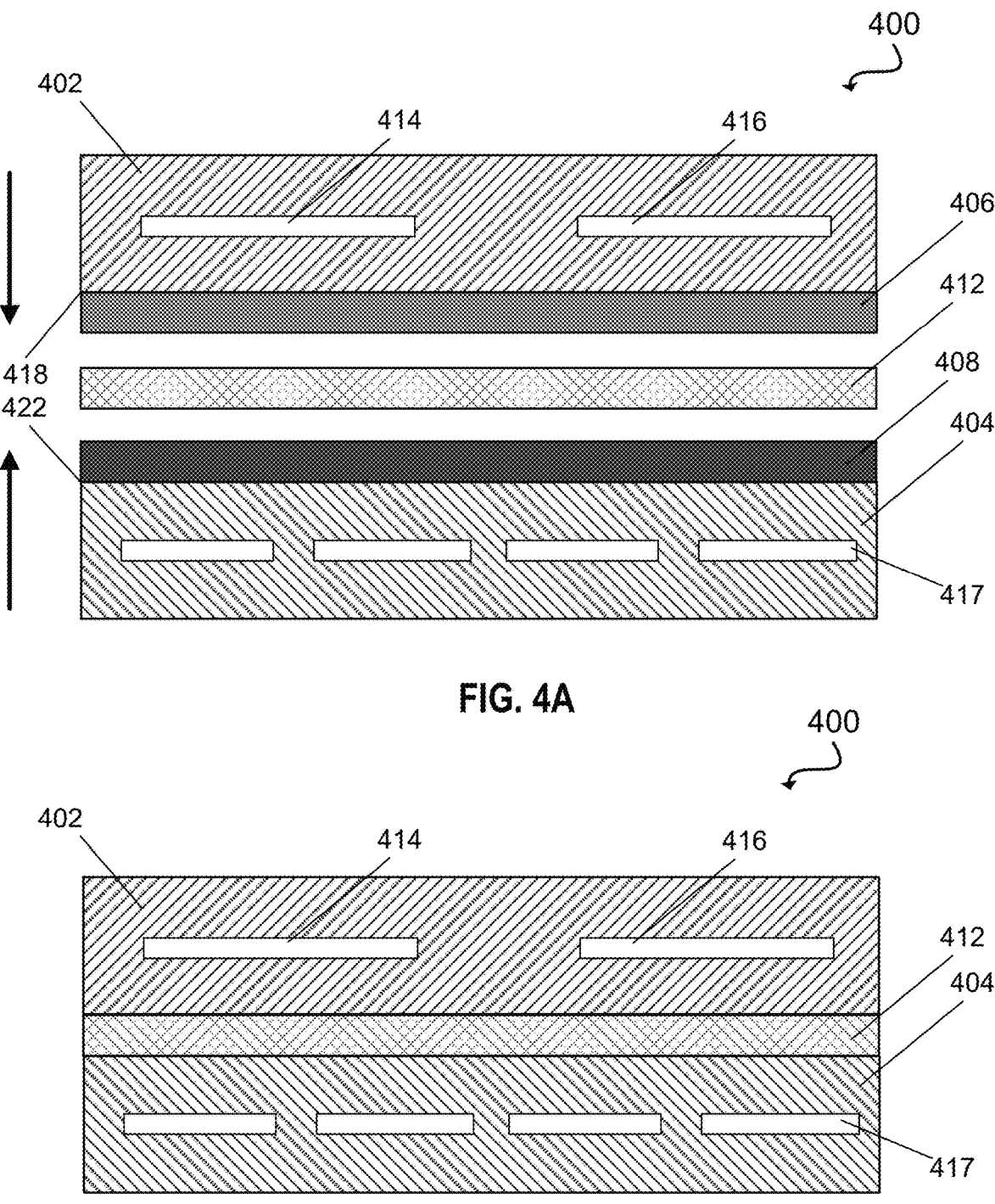
FIGS. 4A and 4B depict a sectional side view of another embodiment of a puck plate assembly in an electrostatic chuck assembly.

FIG. 4A depicts formation of a puck plate assembly 400 in an electrostatic chuck assembly or other substrate support, according to one embodiment. The puck plate assembly 400 is similar to the puck 166 described in FIGS. 2-3, in that it has an upper puck plate 402 (e.g., similar to upper puck plate 230) and a lower puck plate 404 (e.g., similar to lower puck plate 232). Puck plate assembly may additionally have one or more additional puck plates between the upper and lower puck plates. Puck plates 402, 404 can be made of the same material or different materials. Examples of materials that may be used include, but are not limited to, niobium, aluminum oxide, aluminum nitride, and sapphire. In some embodiments, the upper puck plate 402 and the lower puck plate 404 may include the same material or different materials, the same material with different purities, the same material with different grain sizes, or different materials with different grain sizes.

Each of the puck plates 402, 404 may include one or more functional elements, such as a clamping electrode, a zone heater or primary/main heater, a pixelated heater or auxiliary heater, a radio frequency (RF) electrode, a gas channel, a gas pocket, or combinations thereof. In some embodiments, one plate may include a smaller number of main heater electrodes, and another plate may include a larger number of auxiliary heater electrodes. In some embodiments, the main heater electrodes may be configured to handle greater power than the auxiliary heater electrodes.

In the implementation illustrated in FIG. 4A, upper puck plate 402 may include one or more clamp electrodes 414 and one or more RF electrodes 416. Lower puck plate 404 may include one or more heating elements 417, such as a zone heater, or a pixelated heater. In one embodiment, a melting point depressing layer (MDL) 406 may be applied to a bottom surface 418 of the top puck plate 402. MDL 406 may include any metal, such as Ni, Ti, C, Si, or combinations thereof. A second MDL 408 is then applied to a top surface 422 of the bottom puck plate 404. MDL 408 may include any metal, such as Ni, Ti, C, Si, or combinations thereof. Although the top puck plate 402 and bottom puck plate 404 are illustrated to include one or more functional elements, the top puck plate 402 and/or the bottom puck plate 404 may have no functional elements at all in some embodiments. Additionally, though two plates are shown, greater than two plates may be used.

In one embodiment, a metal interlayer 412 is inserted or laid between the top MDL 406 and the bottom MDL 408. Alternatively, metal interlayer 412 may be inserted first, and then the second MDL 406 may subsequently be applied to the bottom surface of the top chuck plate 402. The metal interlayer 412 may be made of any suitable metal, including but not limited to flexible graphite, an organic elastomer, Al, In, Ni, Ti, or an alloy including Ni—Ti or Mo—Mg. The top puck plate 402, the metal interlayer 412, and the bottom puck plate 404 are then aligned such that the materials of the various layers are uniformly aligned to form the puck assembly 400. In embodiments, the MDL layers 406, 408 can be made of the same material or different materials.

In embodiments, the puck assembly 400 is heated, e.g., in an oven or a processing chamber, to fuse the layers together. For example, the puck assembly may be heated to a temperature at or near the eutectic temperature of either MDL layers 406, 408, to thermally bond the top puck plate 402 to the metal interlayer 412 and the metal interlayer 412 to the bottom puck plate 404. Accordingly, the puck assembly may be heated to a temperature at or near the eutectic temperature of either MDL layers 406, 408, to bond the top puck plate 402 to the bottom puck plate 404 via the metal interlayer 412 and/or MDL layers 406, 408. In an example, if one MDL layer has a higher melting point temperature than the other MDL layer, then the puck assembly can be heated up to at least the higher melting point temperature such that both the MDL layers melt and chemically react with the metal interlayer to form a fused metal bond layer between the top puck plate 402 and the bottom puck plate 404. Alternatively, the MDLs 406, 408 can be made of the same material and have the same melting point temperature, or can be made of different materials having the same melting point temperature.

Although only two puck plates are illustrated, the puck plate assembly 400 may include multiple puck plates 402, 404, which may be bonded using the same material or a different material. Additionally, although referred to as puck plates, the puck plates may include one or more ceramic discs, metal discs, or a combination thereof.

FIG. 4B depicts a sectional side view of the puck plate assembly 400 formed as a result of the process described in FIG. 4A. In embodiments, an MDL (not shown) may be applied onto a top surface of a cooling plate (e.g., similar to cooling plate 164 described in FIGS. 2-3). The cooling plate may be aligned with the puck assembly 400 to form an electrostatic chuck assembly. The electrostatic chuck assembly can then be heated to a temperature at or near the eutectic temperature of one of the MDLs to thermally bond the puck assembly 400 and the cooling plate.

Each of the MDLs may be applied using one or more methods, including but not limited to ion beam deposition, thermal evaporation, screen printing, and sintering. Although illustrated as one homogeneous layer, MDLs 406, 408 can be formed in any pattern that may be suitable for the purpose of bonding the upper puck plate 402 to the lower puck plate 404. In some embodiments, the MDLs 406, 408 may take the form of an array, a checkered layer, multiple rows separated by a uniform or non-uniform space, multiple columns separated by uniform or non-uniform spaces, etc. The method may also include isothermally cooling the puck assembly 400 to form an inter metallic compound (IMC) layer between the upper puck plate 402 and the lower puck plate 404. In some embodiments, the puck assembly 400 may be cooled to a temperature below 0° C., for example, −100° C. to −130° C.

Figures 5A, 5B:
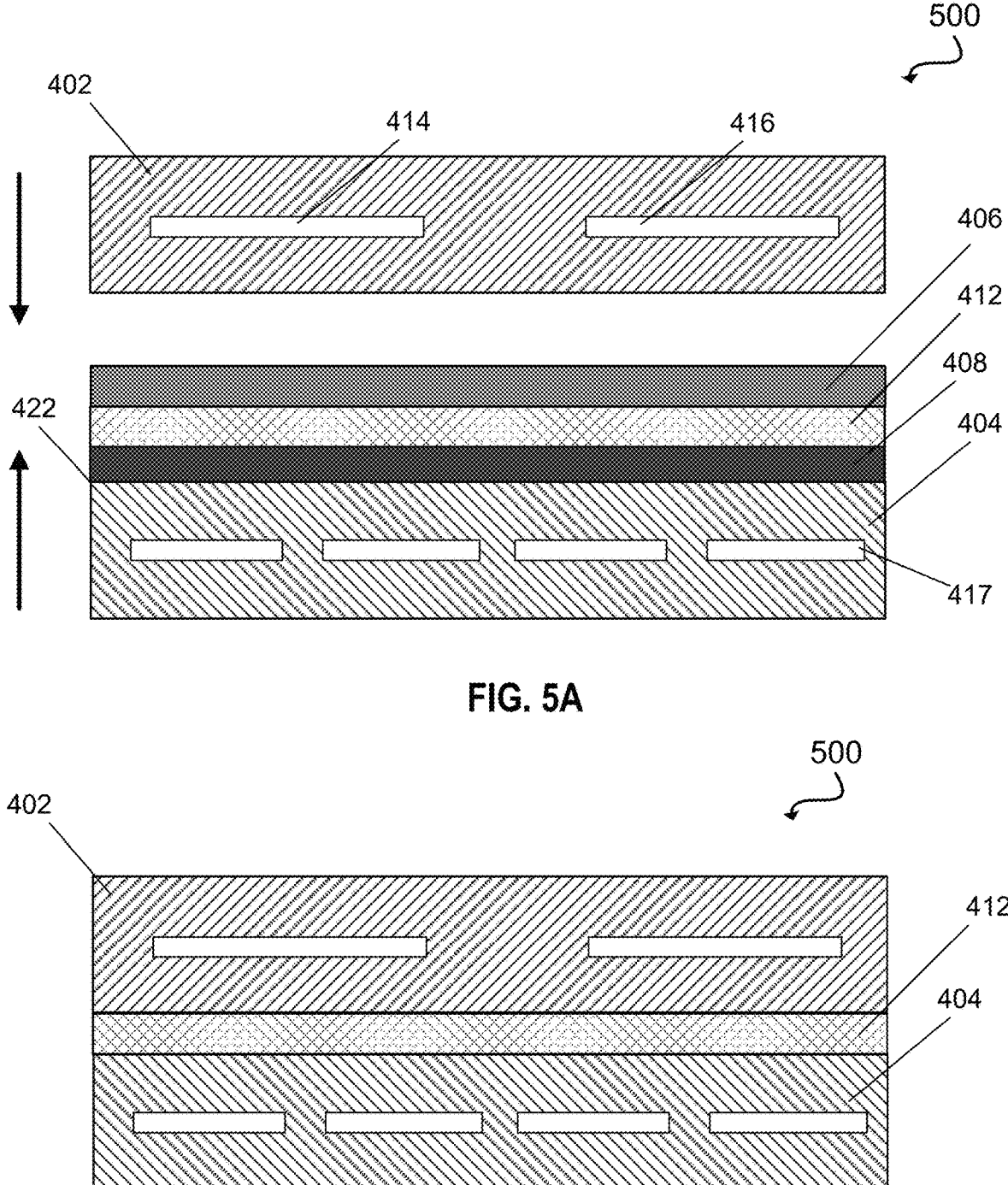
FIGS. 5A and 5B depict a sectional side view of another embodiment of a puck plate assembly in an electrostatic chuck assembly.

FIG. 5A depicts an alternate embodiment where the metal interlayer 412 may be disposed on top of the lower MDL 408, and the second MDL 406 may be applied on top of the metal interlayer 412 instead of a bottom surface 418 of the top chuck plate 402. FIG. 5B depicts a sectional side view of the puck plate assembly 500 formed as a result of the process described in FIG. 5A.

Figures 6A, 6B:
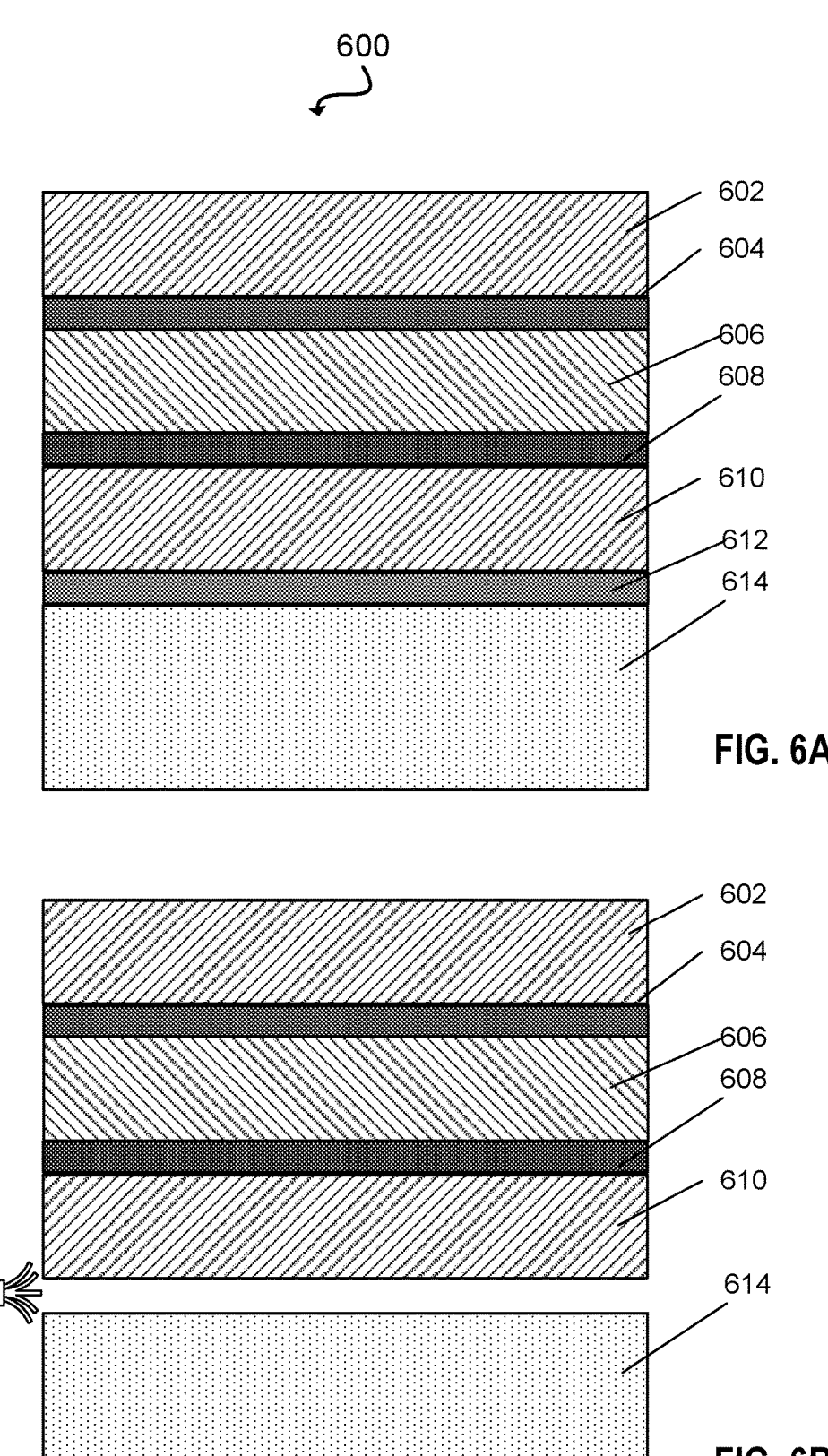
FIGS. 6A and 6B depict a sectional side view of another embodiment of an electrostatic chuck assembly.

FIG. 6A depicts a sectional side view of an electrostatic chuck assembly 600, according to one or more embodiments. Sometimes, after consistent use over a period of time, one or more parts of the ESC assembly may have to be replaced, and in order to do so, one or more parts may be separated from the substrate support assembly. Substrate support assembly 600 may include a cooling plate 614 (e.g., similar to the cooling plate 164 described in FIGS. 2-3), and a puck plate assembly including multiple puck plates 602, 606, 610. More or fewer puck plates may be included in the puck plate assembly. Each of the puck plates 602, 606, 610 can be made of the same material or a different material. Examples of materials that may be used include, but are not limited to, niobium, aluminum oxide, aluminum nitride, and sapphire. Puck plates 602 and 606 may be joined by a bond layer 604. Bond layer 604 may include a metal bond layer (e.g., similar to layer 412 described in FIG. 4) or an organic bond layer, or a polymer bond layer, or a ceramic bond layer, or a combination thereof. The organic bond layer may be formed of any organic material, including but not limited to, an organic elastomer or any polymeric material. Puck plates 606 and 610 may be joined by a bond layer 608. Bond layer 608 may include a metal bond layer (e.g., similar to layer 412 described in FIG. 4) or an organic bond layer, or a polymer bond layer, or a ceramic bond layer, or a combination thereof. The organic bond layer may be formed of any organic material, including but not limited to, an organic elastomer or any polymeric material.

Puck plate 610 and cold plate 614 may be joined by a bond layer 612. Bond layer 612 may include a metal bond layer (e.g., similar to layer 412 described in FIG. 4) or an organic bond layer, or a combination thereof. The organic bond layer may be formed of any organic material, including but not limited to, an organic elastomer or a polymeric material.

In some instances, an electrostatic chuck assembly may degrade over time, and one or more plates of the assembly may cease to function as expected or intended. In such cases, the ESC assembly may be disassembled and one or more plates may be refurbished, replaced, and/or reassembled to reform the same electrostatic chuck assembly after regular maintenance on the individual discs has been performed. The updated assembly may then be reinstalled in a process chamber, thereby extending the life of the ESC assembly.

FIG. 6B illustrates a method for debonding a puck plate assembly from a cold plate 614. The method may include cooling the electrostatic chuck assembly 600 to a temperature lower than 0° C., such as −100° C. to −130° C., such that an organic bond 612 between the cold plate 614 and the puck plate 610 disintegrates and/or breaks down. In some embodiments, a cooling device 620 may be used to cool the assembly 600 to such low temperatures. In one embodiment, the temperature may be lower than a glass transition temperature (Tg) of an organic bonding layer between the puck assembly and the cooling plate 614. Upon disintegration of the layer 612, the cooling plate 614 may be separated from the puck assembly. If any of the puck plates 602, 606, 610 are bonded using an organic bond, then those bonding layers would also disintegrate as a result of the use of cryogenic treatment. Any organic bond layer disintegrated as a result of the cooling can be removed using a chemical treatment, mechanical treatment, radiation, laser ablation, chemical decomposition, polishing, heating in a furnace, liquid nitrogen, or a combination thereof.

Upon separation of the parts, they may be cleaned, repaired, refurbished, and/or replaced, and then re-assembled in the same or different order. For example, the parts may be bonded again using the methods described with respect to FIGS. 4A-5B above. In some embodiments, parts from one assembly are used to form a new assembly that may be suitable for a different purpose than the original assembly was used for (e.g., for a different type of chamber, for different processes, etc.).

Figure 7A:
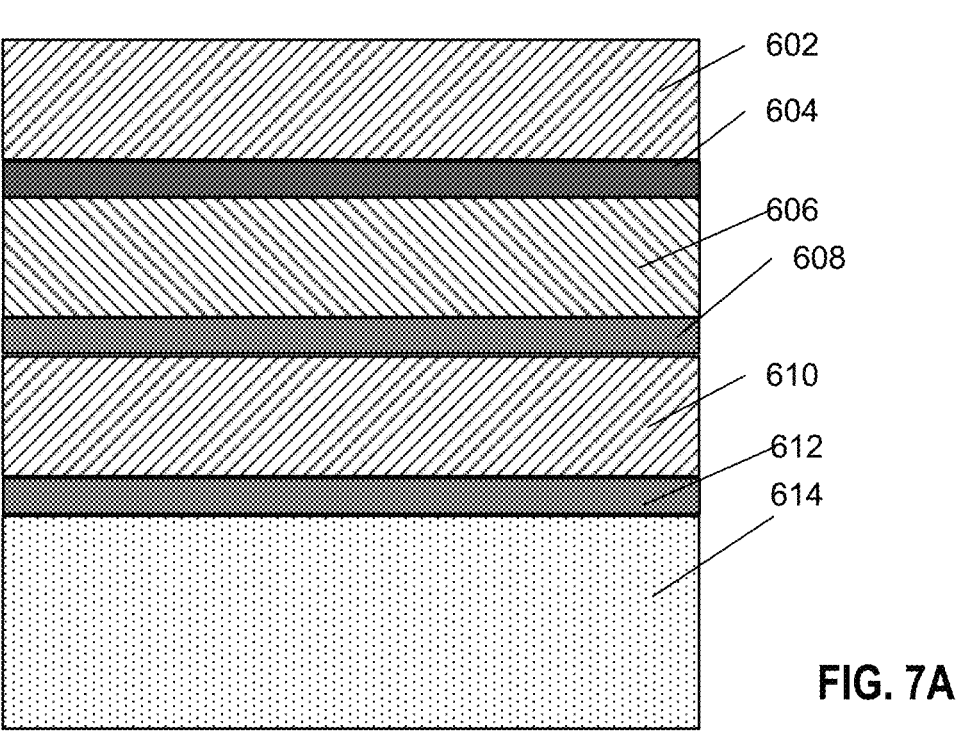
FIGS. 7A and 7B depict a sectional side view of another embodiment of an electrostatic chuck assembly.
Figure 7B:
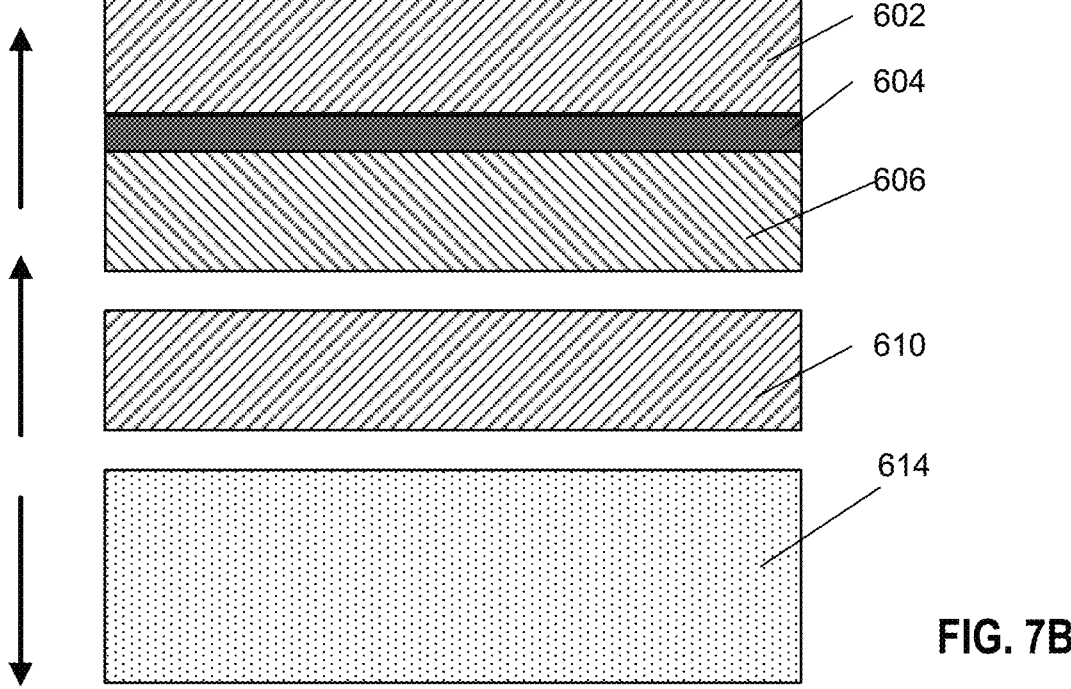

FIG. 7A depicts a sectional side view of another embodiment of an electrostatic chuck assembly where puck plate 606 and puck plate 610 are also bonded by an organic bond layer. As a result of the cooling described with respect to FIG. 6B, puck plate 606 is separated from puck plate 610, and puck plate 610 is separated from 614, as illustrated in FIG. 7B. Any organic bond layer disintegrated as a result of the cooling can be removed using a chemical treatment, mechanical treatment, radiation, laser ablation, chemical decomposition, polishing, heating in a furnace, liquid nitrogen, or a combination thereof.

FIG. 8A depicts a sectional side view of another embodiment of an electrostatic chuck assembly 800. Electrostatic chuck assembly 800 may include a cooling plate 814 (e.g., similar to the cooling plate 164 described in FIGS. 2-3), and a puck plate assembly including multiple puck plates 802, 806, 810. Each of the puck plates 802, 806, 810 can be made of the same material or a different material. Examples of materials that may be used include, but are not limited to, niobium, aluminum oxide, aluminum nitride, and sapphire. Puck plates 802 and 806 may be joined by a bond layer 804. Bond layer 804 may include a metal bond layer (e.g., similar to layer 412 described in FIG. 4). Similarly, puck plates 806 and 810 may be joined by a metal bond layer 808. Similarly, puck plate 810 and cold plate 814 may also be joined by a metal bond layer 812.

FIG. 8B illustrates a method for debonding layers of the ESC assembly 800. The method may include heating the electrostatic chuck assembly 800 to a temperature sufficient for decomposing or melting the metal bond between the puck assembly and the cooling plate, and the puck plates themselves. In some embodiments, the heating temperature may be so high that metal bond between the layers may decompose or melt, resulting in the separation of the layers from each other. Any residual bond matter can be removed using a chemical treatment, mechanical treatment, radiation, laser ablation, chemical decomposition, polishing heating in a furnace, liquid nitrogen, or a combination thereof. Upon separation of the parts, they may be cleaned, repaired, refurbished, and re-assembled in the same or different order. For example, the parts may be bonded again using the methods described with respect to FIGS. 4A-5B above.

In some instances, substrate support assemblies need to be repaired, and in some cases there is a need to partially repair bond edges or completely de-bond and re-bond a stack of the substrate support assembly in order to be cost effective and performance efficient. One advantage of the disclosed methods for manufacturing modular substrate support assemblies is that each disc can include a different ceramic material, and each disc can be isolated and repaired separately when one or more functional elements within a disc are not functioning as intended or expected. Some embodiments cover methods for repairing an ESC. The method may include filling one or more locations on one or more bonding layers with a bonding material.

Figures 9A, 9B:
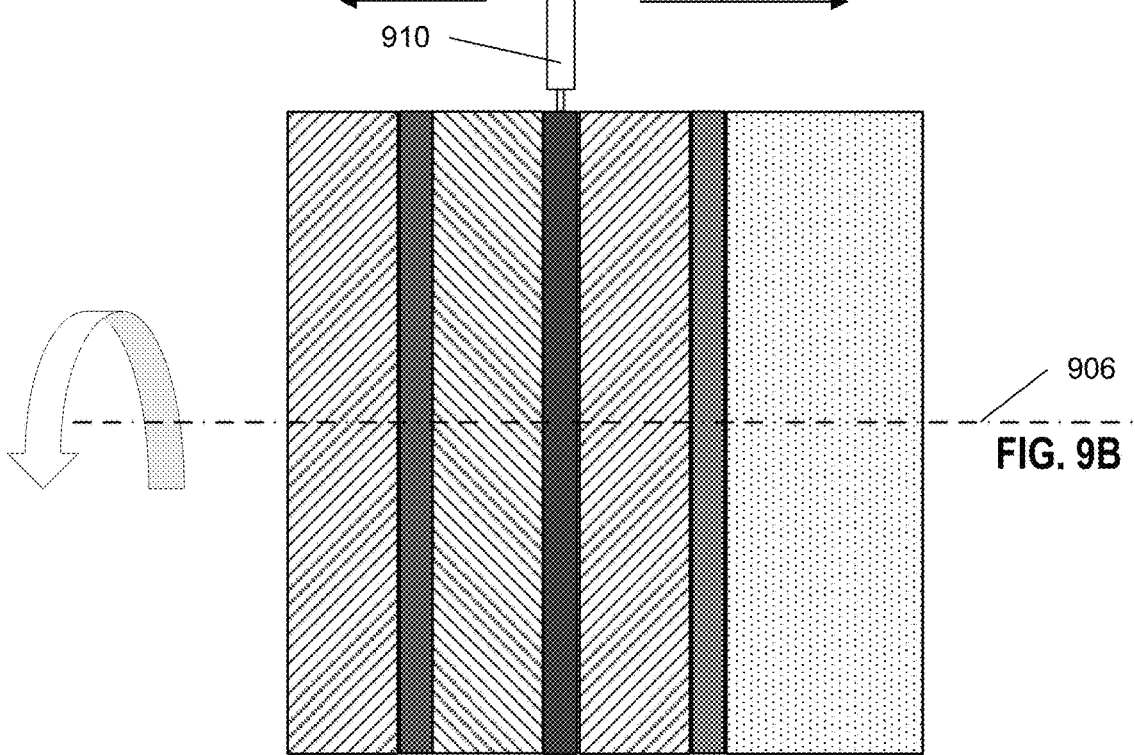
FIGS. 9A and 9B depict a sectional side view of another embodiment of an electrostatic chuck assembly rotatable around an axis.

FIGS. 9A and 9B depict a sectional side view of an embodiment of refurbishing an electrostatic chuck assembly 600. In embodiments, the electrostatic chuck assembly 600 may be placed on a rotatable base, after which the electrostatic chuck assembly 600 may be rotatable around an axis 906. Sometimes, after consistent use over a period of time, one or more bond layers of the ESC assembly may wear off and they may have to be repaired, in-situ. In some instances, separating the parts from the ESC assembly may not be feasible.

FIG. 9A illustrates a method for repairing an ESC 600. The method may include rotating the electrostatic chuck assembly 600 along a vertical or horizontal axis 906, and inspecting a periphery of the electrostatic chuck assembly 600 with a contact or a non-contact detector 902 that may be movable in one or more directions 904. In some embodiments, the contact or non-contact detector 902 inspects the periphery of the electrostatic chuck assembly 600 without rotating the electrostatic chuck assembly 600. Accordingly, the electrostatic chuck assembly 600 may be inspected while it is still in a process chamber in embodiments. The contact detector may include, for example, a feeler gauge or a micro caliper. The non-contact detector may include, for example, an infrared diode array, a camera (e.g., a charge coupled device (CCD) camera), a laser emitter and receiver (e.g., in a laser head), or a combination thereof. In some embodiments, the detector is disposed on an end of a robot arm or other movable component that may move the detector along one or more axes (e.g., vertically) to detect a state of each of the bonding layers. In some embodiments, the detector is disposed at a fixed position and can generate measurements of the bonding layers without movement. For example, a camera may be positioned in a process chamber such that a portion of one or more of the bonding layers is in a field of view of the camera. The camera may periodically generate images, which may then be processed (e.g., using image processing techniques or a trained machine learning model) to determine whether any of the bonding layers of the electrostatic chuck assembly has degraded to a point where refurbishment of the bonding layer is advised.

The detector 902 may identify erosion at one or more locations on one or more bonding layers of the electrostatic chuck assembly 600 based on a result of the inspecting. For example, if an optical detector is used, the data gathered from the optical detector may show that one or more layers are worn out and may need repair.

In embodiments, once a degraded bonding layer is detected, the method involves filling the one or more locations on one or more worn bond layers with a bonding material. The bonding material may include the same material as the one or more bonding layers or a different material. In some embodiments, the bonding material may include any suitable material, including but not limited to, liquid silicone, polytetrafluoroethylene (PTFE), any fluoro elastomer, or a perfluoro elastomer. The method may further include depositing, using a dispenser 910 (e.g., a piezo jet), the bonding material in the one or more locations. The dispenser 910 may be movable in one or more directions 912 so as to precisely fill the layers with the new bonding material. In some embodiments, the electrostatic chuck assembly 600 is rotated about the axis during the deposition of the bonding material. This may ensure that the bonding material is applied to an entirety of a periphery of the bonding layer.

In embodiments, the bonding material is used to fill in gaps in the bonding layer (shown in FIG. 9A) so that the bonding material causes the bonding layer to be flush with an outer periphery of the plate(s) of the electrostatic chuck assembly 600. In some embodiments, the bonding material is deposited such that it bulges from the electrostatic chuck assembly 600. In some embodiments, after depositing the bonding material the bonding material is polished or ground to cause it to be approximately flush with the outer perimeter of the electrostatic chuck assembly 600. The polishing may be performed while the electrostatic chuck assembly 600 is rotated about the axis in embodiments.

FIG. 10 illustrates one embodiment of a process 1000 for bonding two or more layers of an electrostatic chuck assembly. At block 1002, a melting point depressing layer (MDL) may be applied to a bottom surface of a top puck plate. MDL may include any metal, such as Ni, Ti, C, Si, or combinations thereof. At block 1004, a second MDL is then applied to a top surface of the bottom puck plate. Second MDL may include any metal, such as Ni, Ti, C, Si, or combinations thereof. Puck plates can be made of the same material or different materials. Examples of materials that may be used include, but not limited to may include at least one of niobium, aluminum oxide, aluminum nitride, and sapphire. In some embodiments, the upper puck plate and the lower puck plate may include of the same material or different materials, same material with different purities, same material with different grain sizes, or different materials with different grain sizes.

At block 1006, a metal interlayer is inserted or laid between the top MDL and the bottom MDL. Alternatively, metal interlayer may be inserted first, and then the second MDL may be applied to the bottom surface of the top chuck plate. The metal interlayer may be made of any suitable metal, including but not limited to flexible graphite, an organic elastomer, Al, In, Ni, Ti, or an alloy including Ni—Ti or Mo—Mg. At block 1008, the top puck plate, the metal interlayer, and the bottom puck plate are then aligned such that the materials of the various layers are uniformly aligned to form the puck assembly. The MDL layers can be made of the same material or different materials. Similarly, the top puck plate and the bottom puck plate can be made of the same material or different materials. Examples of materials that may be used in forming the top puck plate and/or the bottom plate may include, but not limited to, niobium, aluminum oxide, aluminum nitride, or sapphire.

At block 1010, the puck assembly is heated, in an oven or a processing chamber, to fuse the layers together. For example, the puck assembly may be heated to a temperature at or near the eutectic temperature of either MDL layers to thermally bond the top puck plate to the metal interlayer and the metal interlayer to the bottom puck plate. For example, if one MDL layer has a higher melting point temperature than the other MDL layer, then the puck assembly can be heated up to at least the higher melting point temperature such that both the MDL layers melt and chemically react with the metal interlayer to form a fused metal bond layer between the top puck plate and the bottom puck plate. Alternatively, the MDLs can be made of the same material and have the same melting point temperature, or can be made of different materials having the same melting point temperature.

Although only two puck plates are used as example, the puck plate assembly may include multiple puck plates, which may be bonded using the same material or a different material. Additionally, although referred to as puck plates, the puck plates may include one or more ceramic discs, metal discs, or a combination thereof.

The above described method may also include applying another MDL (not shown) on a top surface of a cooling plate (e.g., similar to cooling plate 164 described in FIGS. 2-3), and aligning the puck assembly on the cooling plate to form an electrostatic chuck assembly. The electrostatic chuck assembly can then be heated to a temperature at or near the eutectic temperature of one of the MDLs to thermally bond the puck assembly and the cooling plate. Each of the MDLs may be applied using one or more methods, including but not limited to ion beam deposition, thermal evaporation, screen printing, and sintering. Although a homogeneous layer can be formed, MDLs can be formed in any pattern that may be suitable for the purpose of bonding the upper puck plate to the lower puck plate. In some embodiments, the MDLs may take the form of an array, a checkered layer, multiple rows separated by a uniform or non-uniform space, or multiple columns separated by uniform or non-uniform spaces, etc. The method may also include isothermally cooling the puck assembly to form an inter metallic compound (IMC) layer between the upper puck plate and the lower puck plate. In some embodiments, the puck assembly 400 may be cooled to a temperature below 0° C., for example, −100° C. to −130° C.

FIG. 11A illustrates one embodiment of a process 1100 for debonding two or more layers of an electrostatic chuck assembly. Each of the puck plates in the assembly can be made of the same material or a different material. Examples of materials that may be used include, but are not limited to, niobium, aluminum oxide, aluminum nitride, and sapphire. Puck plates may be joined by a bond layer that may include a metal bond layer (e.g., similar to layer 412 described in FIG. 4) or an organic bond layer, or a combination thereof. The organic bond layer may be formed of any organic material, including but not limited to, an organic elastomer or any polymeric material. The bottom puck plate and cold plate may also be joined by a bond layer which may include a metal bond layer (e.g., similar to layer 412 described in FIG. 4) or an organic bond layer, or a combination thereof. The organic bond layer may be formed of any organic material, including but not limited to, an organic elastomer or a polymeric material.

At block 1102, the method 1100 may include cooling the electrostatic chuck assembly to a temperature lower than 0° C., such as −100° C. to −130° C., such that the organic bond between the cold plate and the puck plate freezes and become brittle. In some embodiments, a cooling device may be used to cool the assembly to such low temperatures. In one embodiment, the temperature may be lower than a glass transition temperature (Tg) of an organic bonding layer between the puck assembly and the cooling plate. At block 1104, the cooling plate is then separated from the puck assembly. If any of the puck plates are bonded using an organic bond, then those bonding layers would also disintegrate as a result of the use of cryo. Accordingly, the puck plates may also be separated. Any organic bond layer disintegrated as a result of the cooling can be removed using a chemical treatment, mechanical treatment, radiation, laser ablation, chemical decomposition, polishing, heating in a furnace, liquid nitrogen, or a combination thereof.

Upon separation of the parts, they may be cleaned, repaired, refurbished, and re-assembled in the same or different order. For example, the parts may be bonded again using the methods described with respect to FIGS. 4A-5B above.

FIG. 11B illustrates one embodiment of a process 1150 for debonding two or more layers of an electrostatic chuck assembly. At block 1110, the method may include heating the electrostatic chuck assembly to a temperature sufficient for decomposing or melting the metal bond between the puck assembly and the cooling plate, and the puck plates themselves. In some embodiments, the heating temperature may be so high that metal bond between the layers may decompose or melt. At block 1120, the cooling plate may be separated from the puck plate assembly. Additionally, the puck plates may also be separated. Any residual bond matter can be removed using a chemical treatment, mechanical treatment, radiation, laser ablation, chemical decomposition, polishing, heating in a furnace, liquid nitrogen, or a combination thereof. Upon separation of the parts, they may be cleaned, repaired, refurbished, and re-assembled in the same or different order. For example, the parts may be bonded again using the methods described with respect to FIGS. 4A-5B above.

Figure 12:
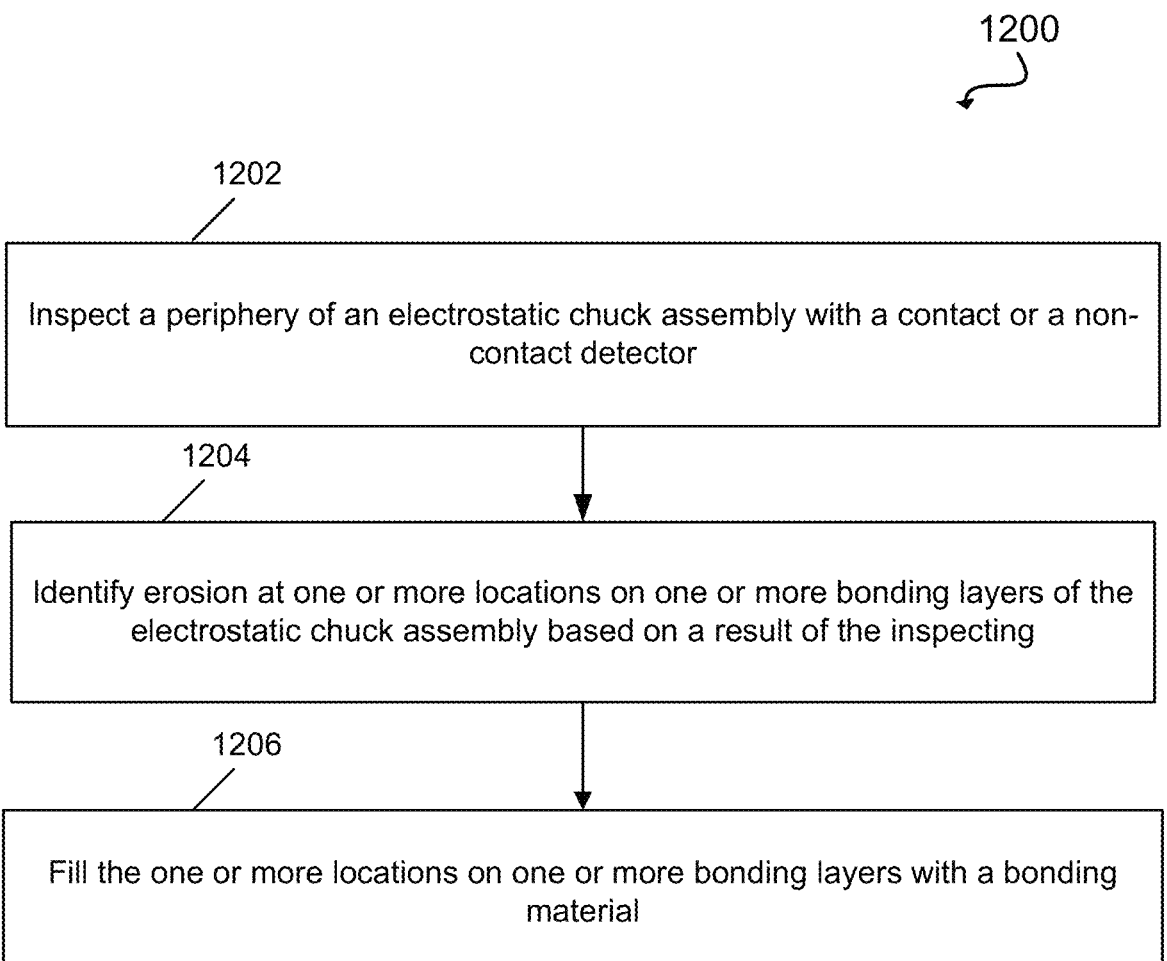
FIG. 12 illustrates one embodiment of a process for repairing an electrostatic chuck assembly.

FIG. 12 illustrates one embodiment of a process 1200 for repairing an electrostatic chuck assembly. The method may include rotating the electrostatic chuck assembly along a vertical or horizontal axis. At block 1202, the method includes inspecting a periphery of the electrostatic chuck assembly with a contact or a non-contact detector that may be movable in one or more directions. The contact detector may include, for example, a feeler gauge or a micro caliper. The non-contact detector may include, for example, an infrared diode array, a CCD camera, a laser head, or a combination thereof. At block 1204, the detector, or data therefrom, may identify erosion at one or more locations on one or more bonding layers of the electrostatic chuck assembly based on a result of the inspecting. For example, if an optical detector is used, the data gathered from the optical detector may show that one or more layers are worn out and may need repair. At block 1206, the method involves filling the one or more locations on one or more worn bond layers with a bonding material. The bonding material may include the same material as the one or more bonding layers or a different material. In some embodiments, the bonding material may include any suitable material, including but not limited to, liquid silicone, polytetrafluoroethylene (PTFE), any fluoro elastomer, or a perfluoro elastomer. The method may further include depositing, using a dispenser (e.g., a piezo jet), the bonding material in the one or more locations. The dispenser may be movable in one or more directions so as to precisely fill the layers with the new bonding material.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method, comprising:
applying a first melting point depressing layer (MDL) to a bottom surface of a first puck plate comprising one or more first functional elements of an electrostatic chuck;
applying a second MDL to a top surface of a second puck plate comprising one or more second functional elements of the electrostatic chuck;
inserting a metal interlayer between the first MDL and the second MDL;
aligning the first puck plate, the metal interlayer, and the second puck plate to form a puck assembly; and
heating the puck assembly, to a temperature at or near an eutectic temperature of the first MDL or the second MDL, to thermally bond the first puck plate to the metal interlayer and the metal interlayer to the second puck plate.

2. The method of claim 1, further comprising:
applying a third MDL on a top surface of a cooling plate;
aligning the puck assembly on the cooling plate to form an electrostatic chuck assembly; and
heating the electrostatic chuck assembly to a temperature at or near an eutectic temperature of the third MDL to thermally bond the puck assembly and the cooling plate.

3. The method of claim 2, wherein the first MDL, the second MDL, and the third MDL are applied using at least one of ion beam deposition, thermal evaporation, screen printing, or sintering.

4. The method of claim 1, further comprising:
isothermally cooling the puck assembly to form an intermetallic compound (IMC) layer between the first puck plate and the second puck plate.

5. The method of claim 1, wherein the first puck plate and the second puck plate comprise at least one of a) a same material with same purities, b) different materials with same grain sizes, c) the same material with different purities, e) the same material with different grain sizes, or f) different materials with different grain sizes.

6. The method of claim 1, wherein the first puck plate and the second puck plate each comprise at least one of niobium, aluminum oxide, aluminum nitride, or sapphire.

7. The method of claim 1, wherein the one or more first functional elements and the one or more second functional elements each comprise at least one of a clamp electrode, a zone heater, a pixelated heater, a radio frequency (RF) electrode, a gas channel, or a gas pocket.

8. The method of claim 1, wherein the metal interlayer comprises at least one of flexible graphite, an organic elastomer, Al, In, Ni, Ti, or an alloy comprising Ni—Ti or Mo—Mg.

9. The method of claim 1, wherein the first MDL and the second MDL comprise at least one of Ni, Ti, C, Si, or a combination thereof.

10. The method of claim 1, wherein a melting point temperature of the first MDL and the second MDL is lower than a melting point temperature of the metal interlayer.

11. A method, comprising:
performing at least one of:
a) cooling a substrate support assembly to a temperature lower than 0° C.; or
b) heating the substrate support assembly to a temperature sufficient for at least one of c) decomposing an organic bonding layer between a puck assembly and a cooling plate of the substrate support assembly or d) melting a metal bond between the puck assembly and the cooling plate; and
separating the cooling plate of the substrate support assembly from a puck assembly of the substrate support assembly.

12. The method of claim 11, further comprising:
separating a first puck plate of the puck assembly from a second puck plate; and
at least partially removing an organic bonding layer between the first puck plate and the second puck plate using a chemical treatment, a mechanical treatment, radiation, laser ablation, chemical decomposition, polishing, heating in a furnace, liquid nitrogen, or a combination thereof.

13. The method of claim 12, further comprising:

applying a first melting point depressing layer (MDL) to a bottom surface of the first puck plate;

applying a second MDL to a top surface of the second puck plate;

providing a metal interlayer between the first MDL and the second MDL;

aligning the first puck plate, the metal interlayer, and the second puck plate to form the puck assembly; and heating the puck assembly, to a temperature at or near an eutectic temperature of the first MDL or the second MDL, to thermally bond the first puck plate to the metal interlayer and the metal interlayer to the second puck plate.

14. The method of claim 13, further comprising:

applying a third MDL on a top surface of the cooling plate;

aligning the puck assembly on the cooling plate to form a new substrate support assembly; and heating the new substrate support assembly to a temperature at or near an eutectic temperature of the third MDL to thermally bond the puck assembly and the cooling plate.

15. The method of claim 14, wherein the first MDL, the second MDL, and the third MDL are applied using at least one of ion beam deposition, thermal evaporation, screen printing, or sintering.

16. The method of claim 11, wherein the temperature lower than 0° C. is about –100° C. to –130° C.

17. The method of claim 11, wherein the temperature is lower than a glass transition temperature (Tg) of an organic bonding layer between the puck assembly and the cooling plate.

18. The method of claim 11, further comprising:

at least partially removing an organic bonding layer between the puck assembly and the cooling plate.

19. The method of claim 18, further comprising:

removing the organic bonding layer between the puck assembly and the cooling plate using a chemical treatment, a mechanical treatment, radiation, laser ablation, chemical decomposition, polishing, heating in a furnace, liquid nitrogen, or a combination thereof.

20. A method comprising:

inspecting a periphery of an electrostatic chuck assembly with a contact or a non-contact detector;

identifying erosion at one or more locations on one or more bonding layers of the electrostatic chuck assembly based on a result of the inspecting; and filling the one or more locations on one or more bonding layers with a bonding material.

21. The method of claim 20, wherein the bonding material comprises a same material as the one or more bonding layers or a different material.

22. The method of claim 20, wherein the non-contact detector comprises at least one of an infrared diode array, a camera, or a laser emitter and detector.

23. The method of claim 20, wherein the contact detector comprises at least one of a feeler gauge or a micro caliper.

24. The method of claim 20, wherein the bonding material comprises at least one of liquid silicone, polytetrafluoroethylene (PTFE), any fluoro elastomer, or a perfluoro elastomer.

25. The method of claim 20, wherein filling the bonding material further comprises:

rotating the electrostatic chuck assembly along a vertical or horizontal axis; and depositing the bonding material in the one or more locations.

* * * * *